United States Patent
Yang

(12) United States Patent (10) Patent No.: US 8,373,265 B2
Yang (45) Date of Patent: Feb. 12, 2013

(54) PACKAGE SUBSTRATE HAVING A THROUGH HOLE AND METHOD OF FABRICATING THE SAME

(75) Inventor: Chih-Kuei Yang, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 8 days.

(21) Appl. No.: 13/197,177

(22) Filed: Aug. 3, 2011

(65) Prior Publication Data

US 2012/0168959 A1 Jul. 5, 2012

(30) Foreign Application Priority Data

Jan. 5, 2011 (TW) ................................ 00100259 A

(51) Int. Cl.
*H01L 23/04* (2006.01)

(52) U.S. Cl. . 257/698; 257/700; 257/773; 257/E23.011; 257/E23.015; 438/15; 438/106; 438/113

(58) Field of Classification Search .......... 257/678–733, 257/E23.001–E23.194, 773; 438/68, 140, 438/15, 106, 113
See application file for complete search history.

(56) References Cited

U.S. PATENT DOCUMENTS

| 4,631,572 | A | * | 12/1986 | Zimmerman | 257/691 |
| 4,881,116 | A | * | 11/1989 | Hidada et al. | 257/700 |
| 5,825,084 | A | * | 10/1998 | Lau et al. | 257/700 |
| 2005/0082653 | A1 | * | 4/2005 | McWilliams et al. | 257/678 |

* cited by examiner

*Primary Examiner* — Jasmine Clark
(74) *Attorney, Agent, or Firm* — Edwards Wildman Palmer LLP; Peter F. Corless; Steven M. Jensen

(57) ABSTRACT

A package substrate includes a core board having a through hole; a circuit layer formed on the core board; a metallic ring disposed on the core board surrounding a contour of the through hole, the metallic ring having opening portions positioned opposite to each other, making the metallic ring having a disconnected manner; and an embedded component installed in the through hole. When the embedded component is deviated in the through hole to allow the electrodes to be in contact with the metallic ring, the electrodes are prevented from coming into contact with the same section of the metallic ring to thereby avoid short circuit.

11 Claims, 3 Drawing Sheets

PACKAGE SUBSTRATE HAVING A THROUGH HOLE AND METHOD OF FABRICATING THE SAME

This application claims under 35 U.S.C. §119(a) the benefit of Taiwanese Application No. 100100259, filed Jan. 5, 2011, the entire contents of which is incorporated herein by reference.

BACKGROUND OF THE INVENTION

1. Field of the Invention

This invention relates to package substrates, and, more particularly, to a package substrate having a through hole, and a method of fabricating the same.

2. Description of Related Art

With the rapid development of semiconductor packaging technology, modern semiconductor devices come in a variety of forms. In order to enhance electrical functionality, passive components are installed on a surface of a package substrate. The passive components are electrically connected via a circuit layer to a semiconductor chip. However, the passive components occupy too much a layout area on the surface of the package substrate. Thus, such a package does not have good enough electrical functionality. To address the problem, manufacturers develop a modern package that has passive components embedded in the package substrate. Accordingly, the package substrate may have a greater layout area on its surface.

FIGS. 1 and 1' show a package substrate 1 according to the prior art. The package substrate 1 includes a core board 10 having a through hole 100, a circuit layer 11 formed on the core board 10, and a metallic layer 12 formed on the core board 10 that surrounds a contour of the through hole 100.

In order to improve alignment precision, the metallic ring 100 is used as a predetermined region for a laser drilling process. After the through hole 100 is formed within the metallic ring 12, a passive component 4 having positive electrodes 40 and negative electrodes 41 formed on two opposite sides thereof, is installed in the through hole 100.

However, in the package substrate 1, since the metallic ring 12 has an inner contour equal to the contour of the through hole 100, when the passive component 4 is installed in the through hole 100, both the positive electrodes 40 and the negative electrodes 41 of the passive component 4 are likely to prop against side walls of the through hole 100, if the passive component 4 is deviated from a desired position. As a result, the positive electrodes 40 and the negative electrodes 41 of the passive component 4 are in contact with the metallic ring 12, as shown in FIG. 1', thereby resulting in a short circuit for the passive component 4.

Therefore, how to avoid the short circuit from occurrence is becoming one of the most popular issues in the art.

SUMMARY OF THE INVENTION

In view of the above-mentioned problems of the prior art, the present invention provides a package substrate, comprising: a core board having a through hole; a circuit layer formed on the core board; a metallic ring disposed on the core board and surrounding a contour of the through hole, the metallic ring having a pair of cutting portions positioned opposite to each other, thereby making the metallic ring in a disconnected manner; and an embedded component installed in the through hole.

The present invention further provides a method of fabricating a package substrate, comprising: forming on a core board a circuit layer and a metallic ring, the metallic ring having a pair of cutting portions positioned opposite to each other, thereby making the metallic ring in a disconnected manner; forming a through hole in the core board within the metallic ring, wherein the metallic ring surrounds a contour of the through hole; and installing in the through hole an embedded component.

In an embodiment of the present invention, the through hole is formed by penetrating the core board with laser beams.

In an embodiment of the present invention, the metallic ring is made of copper.

In an embodiment of the present invention, electrodes are further formed on two opposite sides of the embedded component, wherein the pair of cutting portions are correspondingly located between the electrodes.

In an embodiment of the present invention, when at least another embedded component is further installed, the metallic ring has at least another pair of cutting portions correspondingly formed between the embedded component and the another embedded component.

It is thus known from the above that, since the metallic ring has the pair of cutting portions and is in a disconnected matter, the electrodes of the embedded component is prevented from being in contact with the same segment of the metallic ring, even if the embedded component is deviated from a predetermined position in the through hole. Accordingly, the embedded component is avoided from short circuit.

BRIEF DESCRIPTION OF DRAWINGS

The invention can be more fully understood by reading the following detailed description of the preferred embodiments, with reference made to the accompanying drawings, wherein:

FIG. 2A' is a partial top view of FIG. 2A;

FIG. 2C' is a partial top view of FIG. 2C; and

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
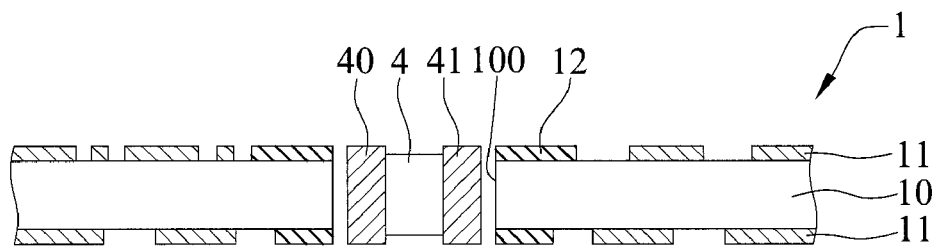
FIGS. 1 and 1' illustrate a package substrate according to the prior art.
Figure 1:
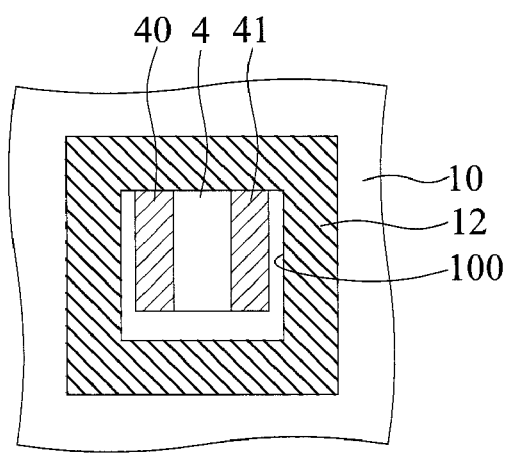
Figure 2A:
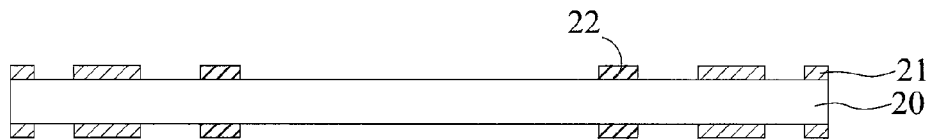
FIGS. 2A, 2B and 2C separately illustrate steps in a method of fabricating a package substrate according to the present invention.
Figure 2A:
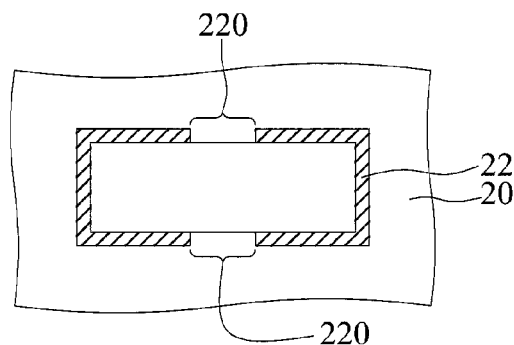
Figure 2B:
Figure 2C:
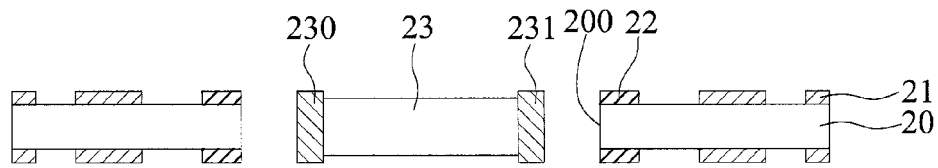
Figure 2C:
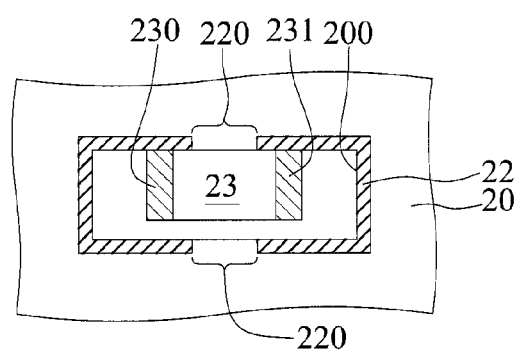

FIGS. 2A to 2C illustrate a method of fabricating a package substrate that has a through hole according to the present invention. The method includes forming a circuit layer 21 and a metallic ring 22 on a core board 20. The metallic ring 22 has a pair of (or two) cutting portions 220 and the cutting portions are positioned opposite to each other. The metallic ring 22 thus is in a disconnected manner. In an embodiment of the present invention, the metallic ring 22 is made of copper.

As shown in FIG. 2B, the core board 20 within the metallic ring 22 is penetrated by laser beams, and a through hole 200 is therefore formed that has a contour surrounded by the metallic ring 22. In an embodiment of the present invention, the metallic ring 22 has an inner contour equal to a contour of the through hole 200.

As shown in FIG. 2C, an embedded component 23 is installed in the through hole 200. A positive electrode 230 and a negative electrode 231 are formed on the two ends of the embedded component 23, respectively. The pair of cutting portions 220 are formed between the positive electrode 230 and the negative electrode 231 correspondingly. In an embodiment of the present invention, the embedded component 23 is an active component or a passive component.

Since the metallic ring 22 has the pair of cutting portions 220 and is in a disconnected manner, the metallic ring 22 is composed of separated segments. Even when the embedded component 23 is deviated from a predetermined position in the through hole 200, and the positive electrode 230 and the negative electrode 231 of the embedded component 23 come into contact with the metallic ring 22 via the inner contour of the metallic ring 22, as shown in FIG. 2C', the positive electrode 230 and the negative electrode 231 of the embedded component 23 are prevented from being in contact with the same segment of the metallic ring 22 (because the cutting portions 220 separate the positive electrode 230 from the negative electrode 231). Therefore, the short circuit for the embedded component 23 is avoided.

Figure 3A:
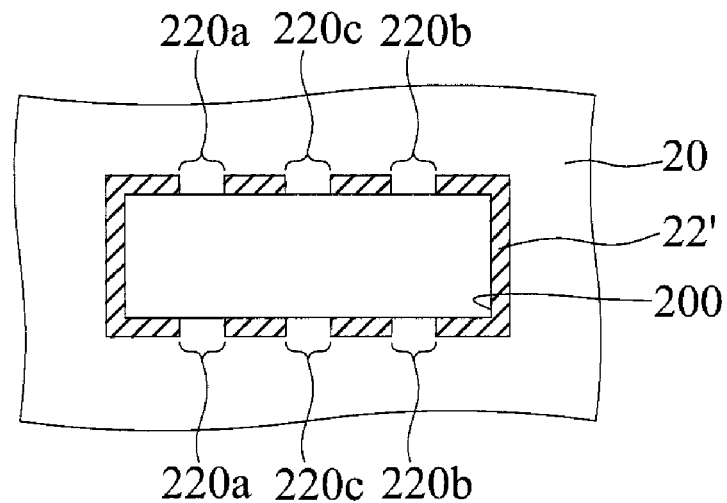
FIGS. 3A and 3B are partial top views of another package substrate according to the present invention.
Figure 3B:
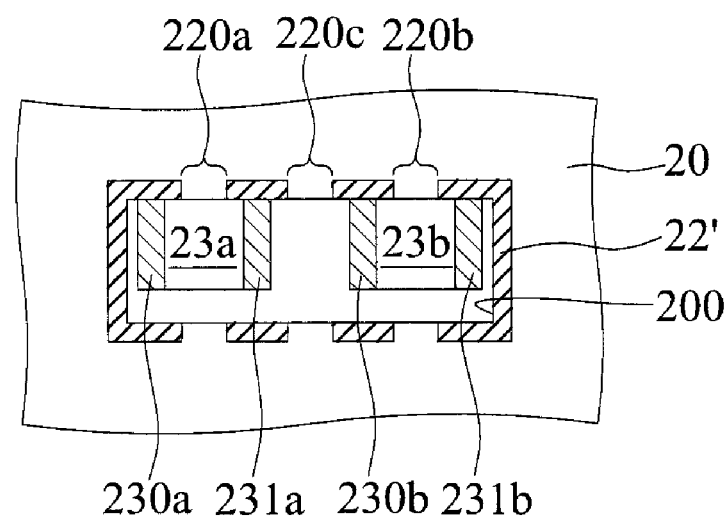

FIGS. 3A and 3B illustrate another embodiment of a package substrate according to the present invention.

As shown in FIG. 3A, three pair of cutting portions 220a, 220b and 220c are separately formed with a metallic ring 22'.

As shown in FIG. 3B, two embedded components 23a and 23b are installed on left-hand side and right-hand side in the through hole 200, respectively. The left pair of cutting portions 220a is positioned between a positive electrode 230a and a negative electrode 231a of the embedded component 23a; the right pair of cutting portions 220b is positioned between a positive electrode 230b and a negative electrode 231b of the embedded component 23b; and the middle pair of cutting portions 220c is positioned between the embedded component 23a and 23b.

In an embodiment of the present invention, since the metallic ring 22' has three pairs of cutting portions 220a, 220b and 220c, and one of the three pairs of cutting portions (i.e., the pair of cutting portions 220c) is positioned between the embedded components 23a and 23b, when the embedded components 23a and 23b are deviated from predetermined positions and the positive electrodes 230a and 230b and the negative electrodes 231a and 231b are thus in contact with the metallic ring 22' via the inner contour thereof, the negative electrode 231a of the left embedded component 23a and the positive electrode 230b of the right embedded component 23b are prevented from being in contact the same segment of the metallic ring 22' (because the cutting portions 220c separate the positive electrode 230b from the negative electrode 231a). Therefore, no short circuit occurs between the embedded components 23a and 23b.

When the positive electrode 230a and the negative electrode 231a of the embedded component 23a are in contact with the metallic ring 22' via the inner contour thereof, the left pair of cutting portions 220a prevents the embedded component 23a from short circuit.

When the positive electrode 230b and the negative electrode 231b of the embedded component 23b are in contact with the metallic ring 22' via the inner contour thereof, the right pair of cutting portions 220b prevents the embedded component 23b from short circuit.

The present invention further provides a package substrate that has the through hole 200. In an embodiment of the present invention, the package substrate comprises the core board that has the through hole 200, the circuit layer 21 formed on the core board 20, the metallic ring 22 installed on the core board 20, and an embedded component 23 installed in the through hole 200.

The metallic ring 22 surrounds the contour of the through hole 200. The metallic ring 22 has a pair of (or two) cutting portions 220 positioned opposite to each other, and thus is in a disconnected manner. In an embodiment of the present invention, the metallic ring 22 is made of copper.

The embedded component 23 has a positive electrode 230 and a negative electrode 231 formed on two opposite sides thereof. The pair of cutting portions 220 are positioned between the positive electrode 230 and the negative electrode 231.

In another embodiment of the present invention, the package substrate has at least two embedded components 23a and 23b, and the pair of cutting portions 220c of the metallic ring 22' is disposed between the embedded components 23a and 23b.

According to a package substrate that has a through hole and a method of fabricating the same of the present invention, since the metallic ring has the pair of cutting portions and is thus in a disconnected manner, electrodes of an embedded component are prevented from being in contact with the same segment of the metallic ring, even if the embedded component, when installed in the through hole, is deviated from a predetermined position and the electrodes of the embedded component are in contact with the metallic ring. Therefore, no short circuit will occur in the embedded component, and product yield is thus increased.

According to an embodiment of the present invention, when more than one embedded component is installed in a through hole, a pair of opening portions of the metallic ring that is disposed between the embedded components prevents electrodes of the embedded components from short circuit, and the embedded components are also protected from short circuit as well.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A package substrate, comprising:
   a core board having a through hole;
   a circuit layer formed on the core board;
   a metallic ring disposed on the core board and surrounding a contour of the through hole, the metallic ring having a pair of cutting portions positioned opposite to each other, so as to make the metallic ring in a disconnected manner; and
   an embedded component installed in the through hole.

2. The package substrate of claim 1, wherein the metallic ring is made of copper.

3. The package substrate of claim 1, further comprising electrodes installed on two opposite sides of the embedded component, wherein the pair of cutting portions are correspondingly located between the electrodes on the opposite sides of the embedded component.

4. The package substrate of claim 1, further comprising at least another embedded component, wherein the metallic ring has at least another pair of cutting portions formed between the embedded component and the at least another embedded component.

5. The package substrate of claim 3, further comprising at least another embedded component, wherein the metallic ring has at least another pair of cutting portions formed between the embedded component and the at least another embedded component.

6. A method of fabricating a package substrate, comprising:
   forming on a core board a circuit layer and a metallic ring, the metallic ring having a pair of cutting portions positioned opposite to each other, so as to make the metallic ring in a disconnected manner;
   forming a through hole in the core board within the metallic ring, in a manner that the metallic ring surrounds a contour of the through hole; and
   installing in the through hole an embedded component.

7. The method of claim 6, wherein the metallic ring is made of copper.

8. The method of claim 6, wherein the through hole is formed by penetrating the core board with laser beams.

9. The method of claim 6, further comprising forming electrodes on two opposite sides of the embedded component, wherein the pair of cutting portions are correspondingly located between the electrodes on the opposite sides of the embedded component.

10. The method of claim 6, further comprising installing at least another embedded component, wherein the metallic ring has at least another pair of cutting portion formed between the embedded component and the at least another embedded component.

11. The method of claim 9, further comprising installing at least another embedded component, wherein the metallic ring has at least another pair of cutting portion formed between the embedded component and the at least another embedded component.

* * * * *